United States Patent [19]

Patterson et al.

[11] Patent Number: 5,554,821
[45] Date of Patent: Sep. 10, 1996

[54] REMOVABLE COMPUTER PERIPHERAL CARDS HAVING A SOLID ONE-PIECE HOUSING

[75] Inventors: Michael W. Patterson, Pleasanton; Hem P. Takiar, Fremont, both of Calif.

[73] Assignee: National Semiconductor Corporation, Santa Clara, Calif.

[21] Appl. No.: 275,985

[22] Filed: Jul. 15, 1994

[51] Int. Cl.⁶ .................................................. H01L 23/28
[52] U.S. Cl. ........................ 174/52.2; 257/787; 361/816
[58] Field of Search ............................. 174/52.1, 52.4; 257/787, 790, 795; 361/737–739, 749, 760, 816, 820

[56] References Cited

U.S. PATENT DOCUMENTS

| | | | |
|---|---|---|---|
| 4,890,197 | 12/1989 | Banjo et al. | 361/392 |
| 5,208,732 | 5/1993 | Baudouin et al. | 361/386 |
| 5,319,522 | 6/1994 | Mehta | 361/748 |
| 5,377,060 | 12/1994 | Nigam | 360/99.01 |
| 5,389,739 | 2/1995 | Mills | 174/52.4 |
| 5,390,082 | 2/1995 | Chase et al. | 361/783 |
| 5,406,117 | 4/1995 | Dlugokecki et al. | 257/659 |
| 5,416,358 | 5/1995 | Ochi et al. | 257/675 |
| 5,438,224 | 8/1995 | Papageorge et al. | 257/777 |

FOREIGN PATENT DOCUMENTS

| | | |
|---|---|---|
| 4341896 | 11/1992 | Japan . |
| 5201184 | 8/1993 | Japan . |

*Primary Examiner*—Peter S. Wong
*Assistant Examiner*—Robert Decker
*Attorney, Agent, or Firm*—Hickman Beyer & Weaver

[57] ABSTRACT

A portable peripheral card for an electrical device is disclosed that has an injected molded housing package. In one aspect of the invention, the peripheral card has a printed circuit board, a female electrical connector, and a solid one-piece injected molded package. The printed circuit board has electrical components mounted thereon and the female electrical connector is attached to the printed circuit board to permit communications between the electrical components on the printed circuit board and the electrical device. The solid one-piece package encapsulates the printed circuit board and the electrical components yet exposes a portion of the electrical connector to facilitate electrical connections between the printed circuit board and the electrical device. In one preferred embodiment, the portable peripheral card is a PCMCIA card.

14 Claims, 9 Drawing Sheets

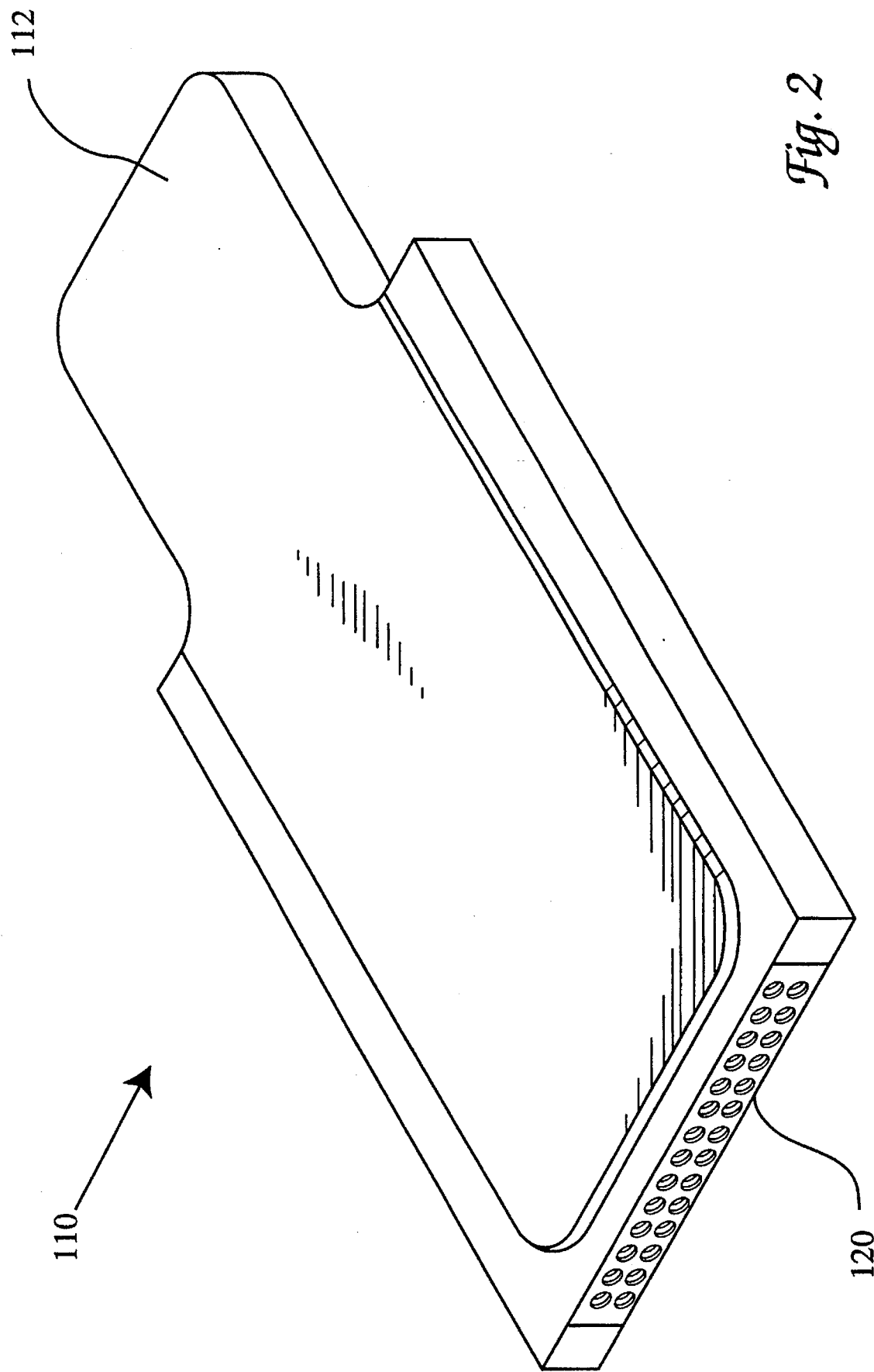

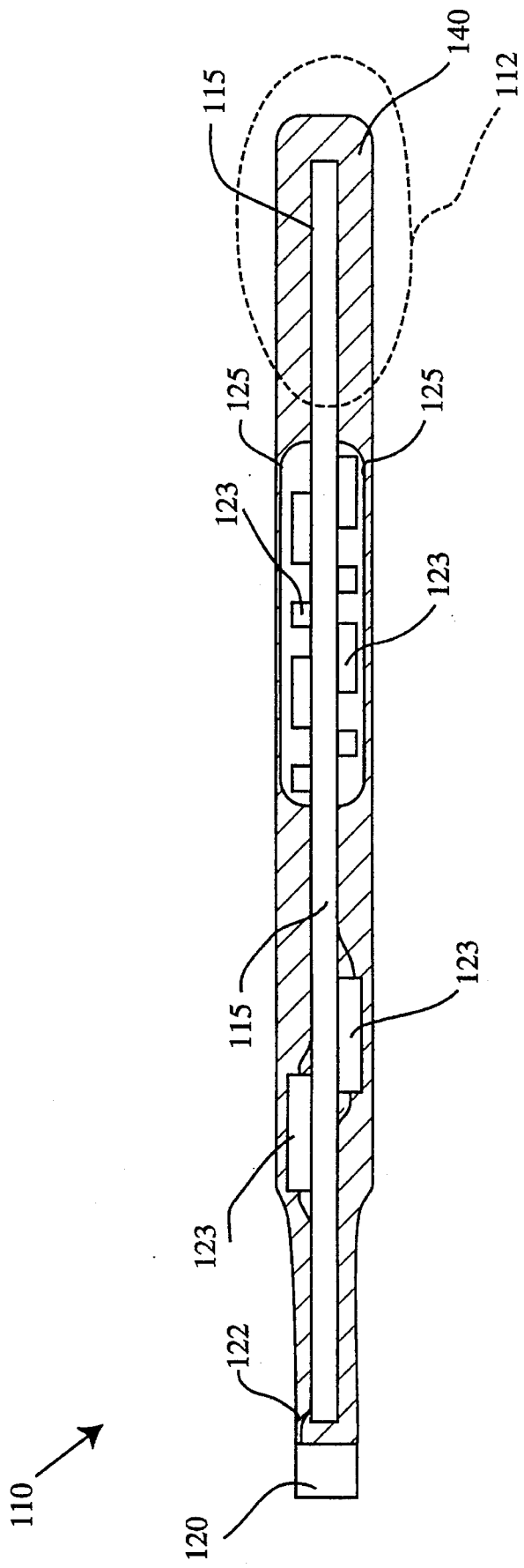

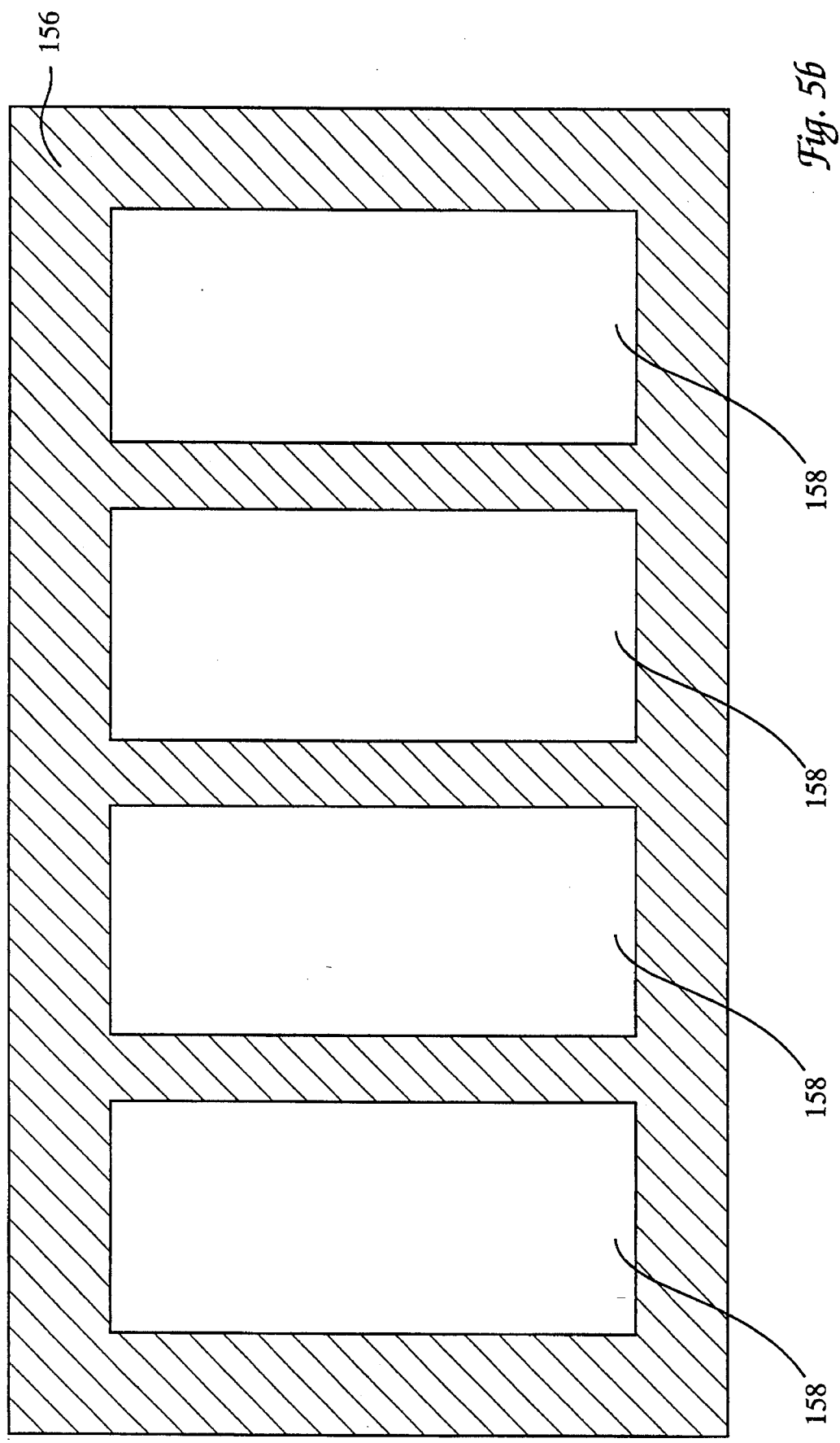

REMOVABLE COMPUTER PERIPHERAL CARDS HAVING A SOLID ONE-PIECE HOUSING

BACKGROUND OF THE INVENTION

The present invention relates generally to the packaging of computer peripheral cards and more particularly to the manufacture of peripheral cards such as PCMCIA cards having injection molded housings.

The widespread use of personal computers has brought about a subsequent demand for expansion boards to enhance their functions. Originally, these boards were mounted internally and therefore required the opening of the computer. However, the advent of the laptop personal computer and handheld computers brought about the development of the portable expansion board called a peripheral or PCMCIA card. PCMCIA cards are inserted in external slots of a laptop or handheld computer without the inconvenience of opening the computer. Their small size and portability allow easy interchange of applications by merely plugging and unplugging different peripheral cards into the external slots of the computer or other electronic device. "PCMCIA" refers to an industry standard for packaging these peripheral cards. Common peripherals available in PCMCIA format include modems, wireless communicators, and memory boards.

A PCMCIA card 10 constructed in a conventional fashion is depicted in FIG. 1. A printed circuit board 15 is electrically coupled to a female PCMCIA connector 20. If the card contains a wireless communicator, it typically requires radio frequency (RF) shields 25 to prevent interference with the computer. The circuit board 15 fits in a groove or shelf in a plastic rim 30 surrounding the circuit board. Sheet metal jackets 35 are attached to the top and bottom of the assembly to form the complete PCMCIA card 10. The metal jackets 35 do provide some RF shielding, but their primary purpose is to provide structural integrity.

Unfortunately, the process of assembling this conventional peripheral card and the assembled card itself possess certain drawbacks. First, the manufacturing process must align and attach several parts: the board, the edge connector, the plastic rim, the RF shields, and the metal jackets. This multistage assembly process is time consuming and labor intensive and therefore quite costly. Second, the use of a plastic rim wastes valuable printed circuit board real estate. Third, the sheet metal jackets are generally fairly flexible implying a relatively weak external protective structure for the board. These drawbacks could be overcome by a method of manufacturing peripheral cards such that the resulting card would have a solid, one-piece, housing replacing the plastic rim and metal jackets.

SUMMARY OF THE INVENTION

To achieve the foregoing and other objects and in accordance with the purpose of the present invention, a portable peripheral card for an electrical device is disclosed that has an injected molded housing package. In one aspect of the invention, the peripheral card has a printed circuit board, an electrical connector, and a solid one-piece injected molded package. The printed circuit board has electrical components mounted thereon and the electrical connector is attached to the printed circuit board to permit communications between the electrical components on the printed circuit board and the electrical device. The solid one-piece package encapsulates the printed circuit board and the electrical components yet exposes a portion of the electrical connector to facilitate electrical connections between the printed circuit board and the electrical device. In one preferred embodiment, the portable peripheral card is a PCMCIA card. In another preferred embodiment, the solid one-piece package is formed from a thermoset plastic. The solid one-piece package of the peripheral card is stronger and more durable than conventional peripheral card packages. The solid package also permits the use of previously unused printed circuit board real estate.

In another aspect of the invention, a PCMCIA card may be provided which eliminates the printed circuit board, but the packaging material is arranged to encapsulate a plurality of integrated circuits and essentially form a multi-chip package that includes a female PCMCIA connector.

In a method aspect of the invention, a method for packaging a portable peripheral card for an electronic device is disclosed. An electrical connector is attached to a printed circuit board having electrical components mounted on the board. The electrical connector forms an external connection for the electrical components mounted on the printed circuit board. The printed circuit board is positioned in the mold and a packaging material is injected into the mold to encapsulate the printed circuit board while leaving a portion of the electrical connector exposed. The packaging material is cured to form a solid one-piece housing surrounding the printed circuit board such that a portion of the connector is exposed to permit electrical connections to the electrical device.

A method for simultaneously packaging multiple portable peripheral cards is also disclosed. The method includes forming a panel having slots that delineate multiple printed circuit boards and several tabs interconnecting the boards. The cards are assembled on the panel by attaching appropriate electrical components to each of the printed circuit boards. An electrical connector is also attached to each of the printed circuit boards. The panel is positioned in a mold having chambers such that each of the printed circuit boards is positioned in an associated chamber. A packaging material is then injected into the mold to individually encapsulate the peripheral cards. Thereafter, the packaging material is allowed to solidify, and the peripheral cards are separated. This method is particularly useful in the mass production of packaged PCMCIA cards.

In one preferred embodiment, female edge connectors are used the methods further include placing plugs in openings of the female connectors to prevent flow of the packaging material into the openings.

In another preferred embodiment, the panel or board includes tabs and/or trim about its periphery, and the positioning steps include supporting the panel by supporting the tabs and/or trim by edges of the mold. The printed circuit boards and the components mounted on it are thus prevented from contacting bottom surfaces of the mold chambers. The described methods are particularly applicable to the packaging of PCMCIA cards. In the processing of PCMCIA cards, the method of the invention is estimated to eliminate at least three quarters of the packaging costs.

BRIEF DESCRIPTION OF THE DRAWINGS

The invention, together with further objects and advantages thereof, may best be understood by reference to the following description taken in conjunction with the accompanying drawings in which:

FIG. 2 is perspective view of a PCMCIA peripheral card made in accordance with the present invention.

FIG. 3 is a diagrammatic side view of the PCMCIA peripheral card shown in FIG. 2.

FIGS. 5a–5e are diagrammatic representations illustrating steps in a method of simultaneously packaging multiple peripheral cards in accordance with another embodiment of the present invention.

DETAILED DESCRIPTION OF THE INVENTION

Figure 1:
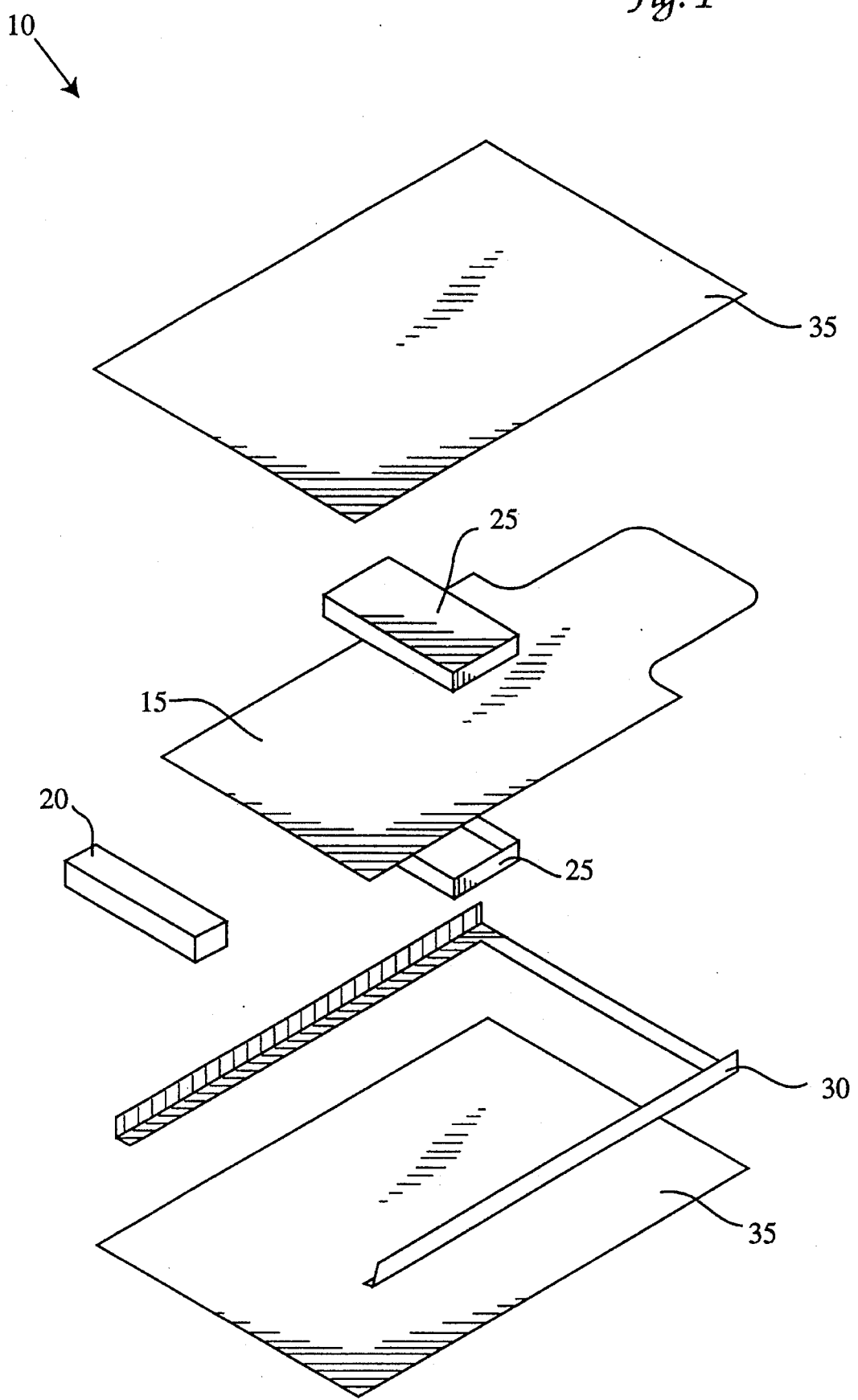
FIG. 1 is an exploded view of a conventional PCMCIA peripheral card.

A portable computer peripheral card 110 made in accordance with the present invention is shown in FIGS. 2 and 3. In the embodiment shown therein, the peripheral card is sized and configured to meet the form factor requirements of a PCMCIA card. The peripheral card 110 includes a printed circuit board 115 having a plurality of components mounted thereon, a female edge connector 120 and a substantially solid one piece housing that encapsulates the printed circuit board and the components mounted thereon.

As best seen in FIG. 3, the peripheral card 110 contains a printed circuit (PC) board 115 attached to the edge connector 120 by wires 122. Various components 123 are mounted on the printed circuit board 115. The components 123 may include typical circuit components such as plastic encapsulated integrated circuits, resistors, capacitors, inductors, multi-chip packages, etc., as well as integrated circuits mounted directly on the printed circuit board 115 using conventional chip-on-board and chip-on tape techniques. The components 123 may be mounted on either side or both sides of the circuit board 115. The embodiment shown is a wireless communicator. Thus, as best seen in FIG. 2, a tab portion 112 is provided. The tab portion is optional and indeed in most embodiments, the tab would not be provided. When present, the tab portion would typically extend outside the casing of a computer or electronic device when the peripheral card is plugged in. In the wireless communicator shown, the tab portion contains an antenna for a wireless communicator card. Of course, the tab portion could be provided with other types of cards as well when desirable.

As in conventional PCMCIA packaging technology for wireless communicators, some of the components 123 may be enclosed inside a metal RF shield 125 to prevent interference with the computer or electronic device. This shield 125 is generally in the portion of the card 110 which is inserted into the computer and not on the tab 112 which remains outside of computer.

A solid one-piece package 140 encapsulates the printed circuit board 115 and replaces the plastic rim plus sheet metal jacket arrangement of conventional PCMCIA packaging. The housing 140 is preferably made of plastic although other suitable materials may be used. Thermoset plastic appears to be particularly amenable to the injection molding process described below. The solid plastic housing has several advantages over conventional peripheral card packaging techniques. Initially, it is stronger than the rim plus jacket arrangement and provides an air-tight seal about the printed circuit board 115 thus limiting damage and contamination of the circuit components 123 and the circuit board itself. By eliminating the rim, the solid housing 140 provides greater space or "real estate" for components 123 on the board 115. In addition to its structural superiority, the housing 140 is less expensive to produce and assemble than the plastic rim plus metal jacket arrangement of the prior art. Using the methods of manufacture described below, roughly three quarters of the PCMCIA peripheral card packaging costs can be saved when compared to current techniques. Further, the described structure provides an airtight/watertight seal to better protect the printed circuit board and electronic components.

Figure 4A:
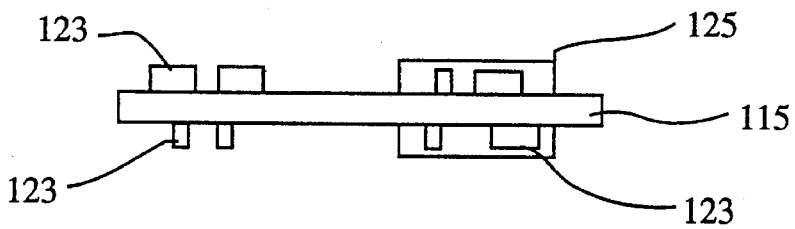
FIGS. 4a–4e are diagrammatic views illustrating steps in a method of packaging a single peripheral card in accordance with one embodiment of the present invention.

A method suitable for packaging the portable peripheral card 110 will now be described with reference with FIGS. 4a–4e. Initially, the card's components 123 is assembled on a suitable printed circuit board 115 in any suitable conventional manner as shown in FIG. 4a. When an RF shield 125 is used, it may be provided as well.

The connector 120 (which may take the form of a standard female PCMCIA connector) is then attached to the printed circuit board 115 in a conventional manner. This may be accomplished in any suitable manner. By way of example, wires 122 may be extended between the printed circuit board traces and the connector 120 as shown in FIG. 4b or the printed circuit board traces may be directly coupled to the connector 120.

Figure 4B:
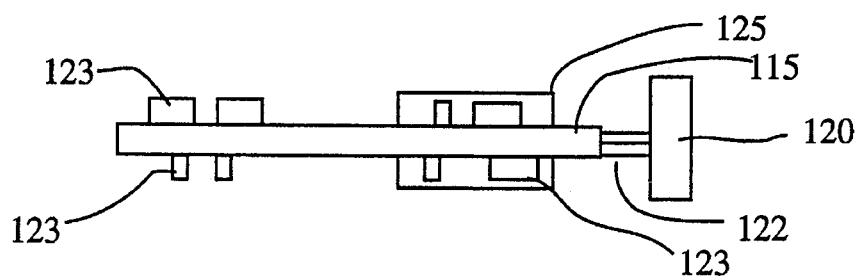
Figure 4C:
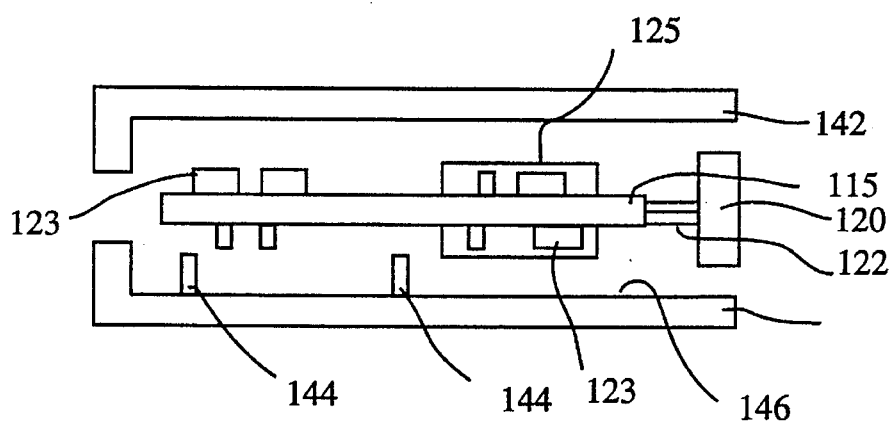

The edge connector with the printed circuit board arrangement is then positioned in a mold 142 in an open position as shown in FIG. 4c. In the embodiment shown, the portion of the edge connector 120 remains exposed outside the mold to prevent the molding material from entering the female receptacles in the connector 120. In alternative embodiments, the entire assembly may be inserted in the mold and a plug or the like may be inserted into the female receptacles in the connector 120 from either side or other suitable provisions may be made to prevent the molding material from fouling the connector receptacles. The plugging procedure may vary depending upon which side they are inserted into. If the plugs are inserted on the exterior of the connector, mechanical plugs can be used. If done from the inside, the plugs will usually become part of the packaged card. Suitable plugs can be made from potting compounds or plastic plugs. Supports 144 may be required to prevent the board 115, its components 123, or the RF shield 125 from contacting a bottom surface 146 of the mold 142. These supports 144 may be particularly useful when the PC board 115 is not large enough to reach the edge of the mold away from the connector. (This is the left side in FIGS. 4a–e.). During molding, these supports may be retracted in a coordinated fashion to minimize the exposure of the printed circuit board 115.

The steps just described in relation to FIGS. 4a–c may be readily interchanged. For example, the edge connector 120 may be attached after the circuit board 115 is positioned in the mold 142. Similarly, the components 123 may be mounted onto the board 115 after the attachment of the edge connector 120 or after the positioning of the board 115 in the mold 142.

Figure 4D:
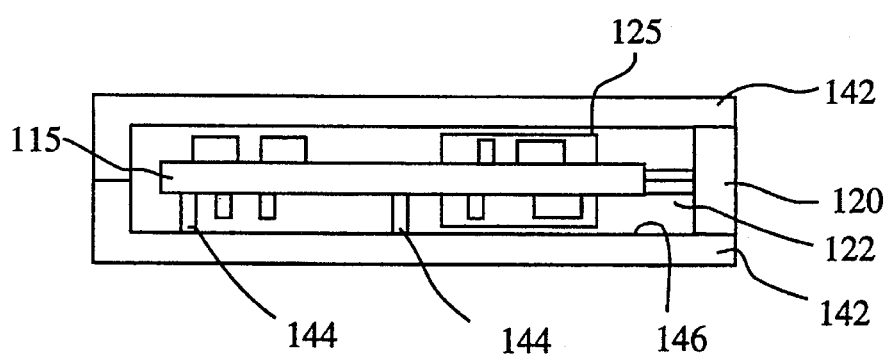

After positioning the board 115 in the mold 142, the mold is closed as illustrated in FIG. 4d, and a packaging material 140 is injected into the mold. As stated previously, the packaging material 140 is preferably thermoset plastic material although other materials including conventional thermoplastics may be used. Thermoset plastic's low viscosity at relatively low injection temperatures permits its injection into the mold 142 at low pressures. This low pressure and viscosity reduces the possibility of damage to components 123 and wires 122. The ability to inject at relatively lower temperatures prevents thermal damage to the components 123. By way of example, suitable ranges for pressures of the injected thermoset plastic are about 100 to 500 pounds per square inch and at a mold temperature of about 150 to 200 degrees Celsius, respectively. A paste form of thermoset plastic is typically injected into the heated mold. Upon contact with this heated environment, thermoset plastic undergoes a chemical reaction which causes it to become less viscous and then harden automatically within a specified time. The low injection temperature of the thermoset plastic avoids overheating the printed circuit boards 115 thereby avoiding the danger of solder reflow of board connections. Suitable thermoset plastics include polymeric hybrid materials such as the Almec™ Resin Systems available from Thermoset™ of Indianapolis, Ind. In contrast, thermoplastic materials generally become liquid upon heating and harden after cooling. Therefore, thermoplastic materials usually require heating of the thermoplastic itself before injection in the mold 142 at temperatures too extreme to prevent solder reflow.

Figure 4E:
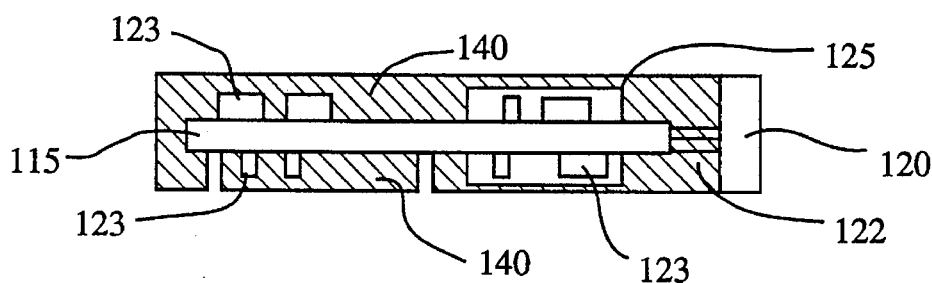

After the injection step, the packaging material 140 is cured to form a solid one-piece housing 140 as shown in FIGS. 3 and 4e. This curing step may merely include allowing the packaging material 140 to sit in the mold 142 until the material hardens, or it may include a sequence of steps of actively heating or cooling the packaging material 140. As noted above, when thermoset plastic is used the curing step is automatic and is characteristic of the chemical properties of thermoset plastic. Again, in contrast, it is generally advantageous to cool thermoplastic to hasten its solidification.

The described method of manufacturing the peripheral cards has several advantages over the fabrication of conventional peripheral cards. Initially, the process is far less time consuming and labor intensive than conventional packaging methods. It is believed that the described manufacturing method will save on the order of approximately three quarters of the PCMCIA peripheral card packaging costs when compared to conventional methods. Additional savings may be achieved by the mass production methods of packaging described below. The savings extend beyond simply savings on the costs of the packaging material (which are quite substantial). For example, the described process can be used to package several types of peripheral cards without alternating a packaging equipment set-up and without requiring the design of the dedicated plastic rims used in conventional packages. Therefore, manufacturing equipment costs can be amortized over several product lines, and barriers to market entry for new product lines can be dramatically reduced.

Figure 5A:
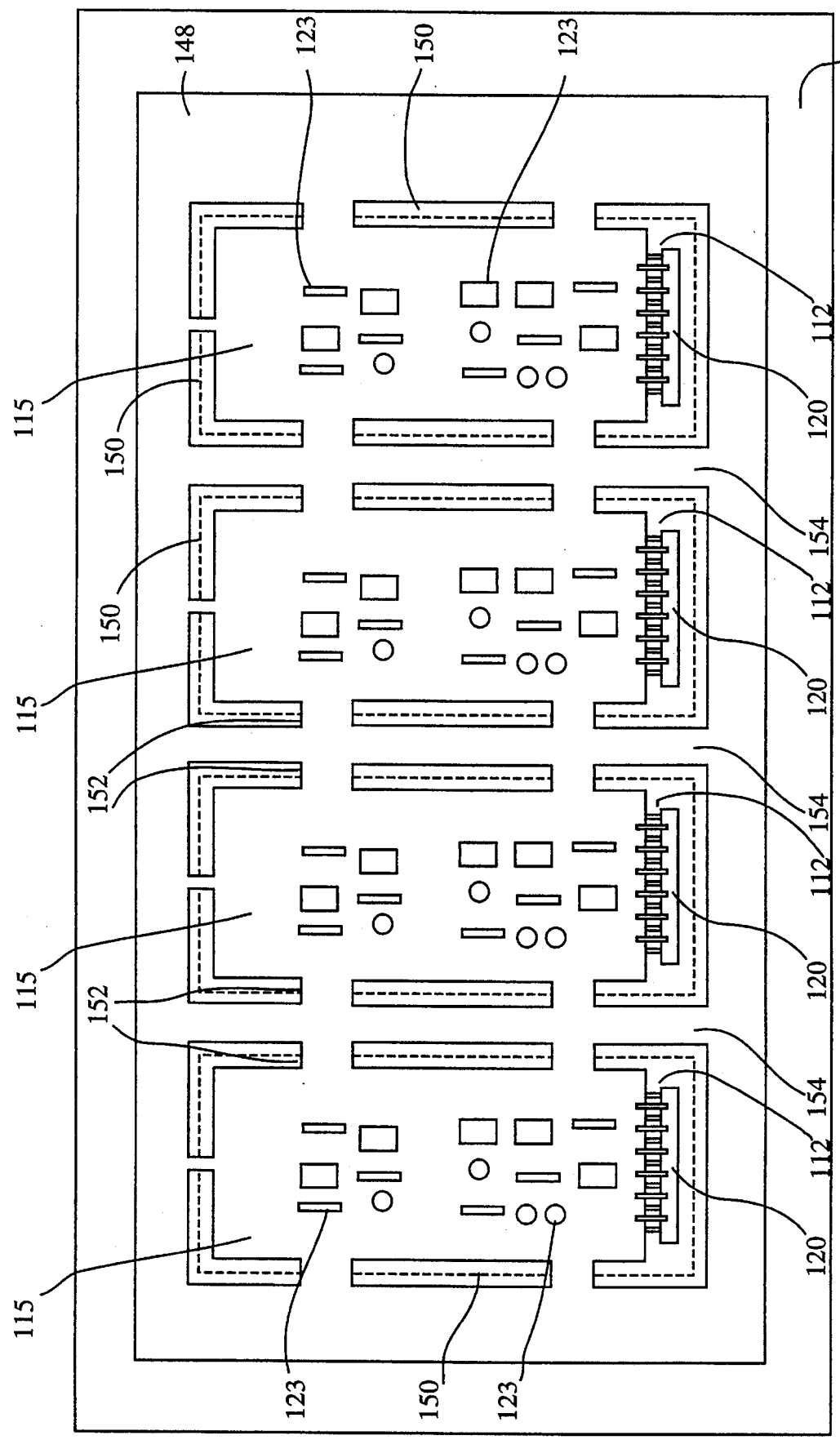

A method of simultaneously packaging several portable peripheral cards 110 will now be described with reference to FIGS. 5a–5f. Such a method is more suitable for mass production than the packaging method described in reference to FIGS. 4a–4e and takes advantage of conventional strip based printed circuit board assembly techniques. The method begins by forming a conventional panel 148 from a material suitable for printed circuit boards. The panel 148 has several slots 150 which delineate printed circuit boards 115, trim 154 which surrounds the printed circuit boards and tabs 152 which connect the printed circuit boards to the trim. FIG. 5a shows a panel 148 having four printed circuit boards 115 although, of course, the panel could have any suitable number of boards 115. Appropriate components 123 is attached to the boards 115 to form the desired circuits such as modems, wireless communicators, memory devices, etc. One need not assemble the same type of circuit on each card, although that would normally be the case. The connectors 120 are attached to the circuit boards 115 in a conventional manner as well.

The panel 148 is positioned in a mold having several chambers such that each printed circuit board 115 is positioned in an associated chamber. A top view of a bottom half of such a mold 156 having four chambers 158 is shown in FIG. 5b. These chambers are outlined in FIG. 5a by the dashed rectangles. Once the mold is properly positioned, a suitable packaging material (such as the thermoset plastics described above) is injected into each mold to form the four packages.

Figure 5C:
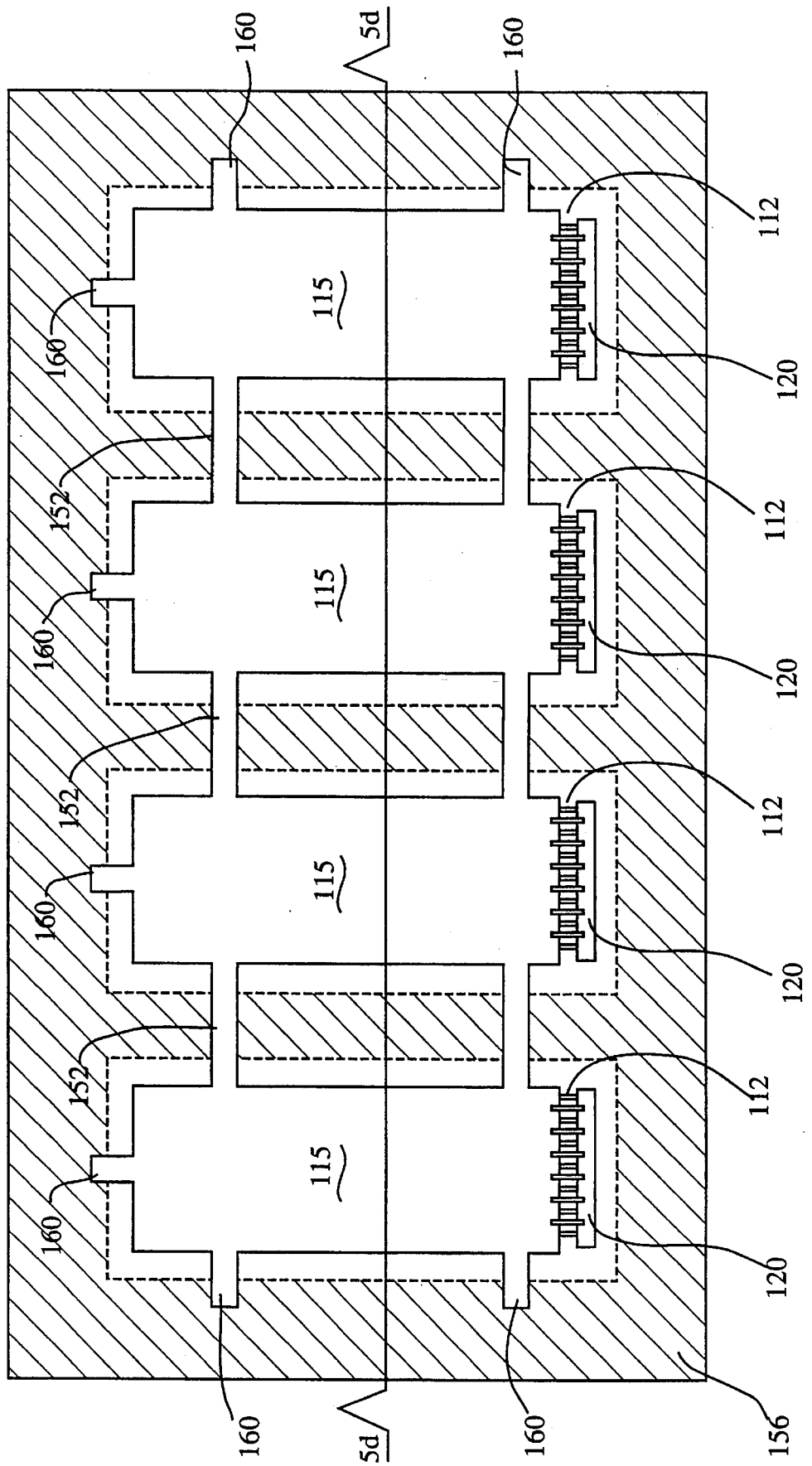

Besides the clear advantage of the ability to manufacture several peripheral cards simultaneously, the described method allows the elimination of the supports 144 discussed above with reference to FIGS. 4c–d. Specifically, in this embodiment, the printed circuit boards are supported in the molds by the edging materials (i.e. the tabs 152 and trim 154) which are clamped into place by the mold 156. The elimination of the need to provide supports 144 has the benefit of providing additional usable real estate on the printed circuit boards 115. FIG. 5c shows a further development of this idea where the trim of the panel 148' has been removed and only the tabs 152' and 160' remain. Thus the tabs 152' directly connect the printed circuit boards 115' to each other and the mold 156' supports the panel 148' only by the tabs 152' and 160'.

Figure 5D:
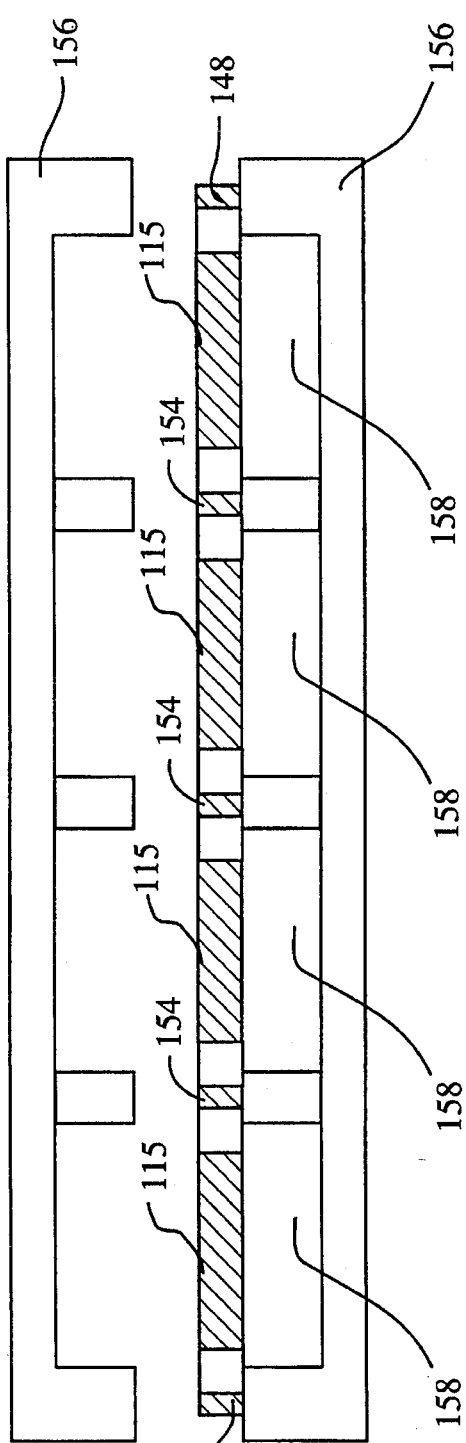
Figure 5E:
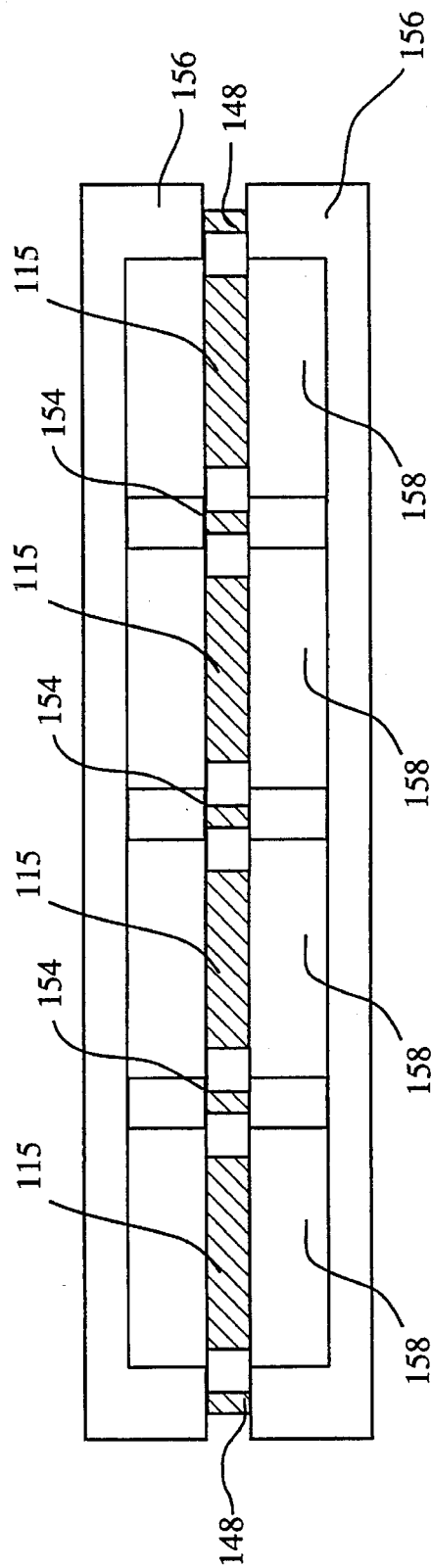

A side cross-sectional view of the panel 148 positioned in the open mold 156 is shown in FIG. 5d corresponding to the top view shown in FIG. 5a. The trim 154 is placed on mold surfaces to support the panel 148 at a position such that the printed circuit boards 115 are spaced apart from the bottom halves of the mold chambers 158. After positioning the panel 148 in the mold 156, the mold is closed as shown in FIG. 5e. As in the method described above for packaging single PCMCIA cards, a packaging material 140 (not shown) is injected into the mold chambers 158 and allowed to solidify to form four individual solid one-piece housings 140 about the four printed circuit boards 115. As before, the packaging 140 is preferably formed from thermoset plastic, but other suitable materials may be used. The cards are then separated from each other to form four PCMCIA cards 110 having individual solid one-piece housings 140 each containing a single printed circuit board 115.

It should be appreciated that the described panel based method of manufacturing is particularly well suited for automated productions lines wherein the various components and the PCMCIA connectors are mounted on the printed circuit boards by a robotics manipulator and the assembly is then automatically transferred to the mold in which the injection molding occurs. It should also be appreciated that the trim and/or tab support concept can also be used to support a single printed circuit board in a mold in manufacturing methods that individually package the peripheral cards.

Figure 6A:
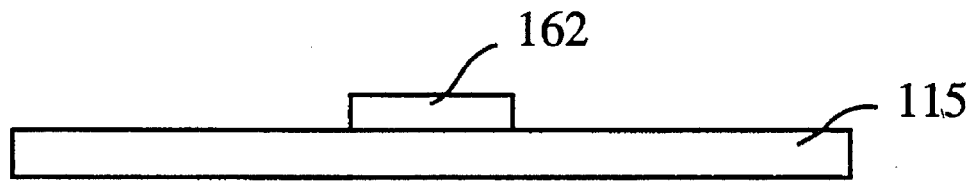
FIGS. 6a–6c are diagrammatic representations illustrating steps in a method of packaging a chip-on-board component on the printed circuit board of a peripheral card in accordance with another embodiment of the present invention.
Figure 6B:
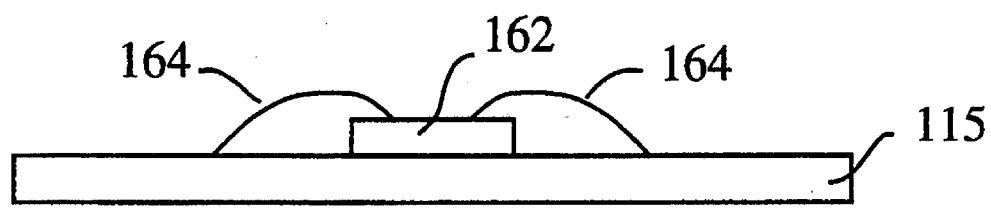
Figure 6C:
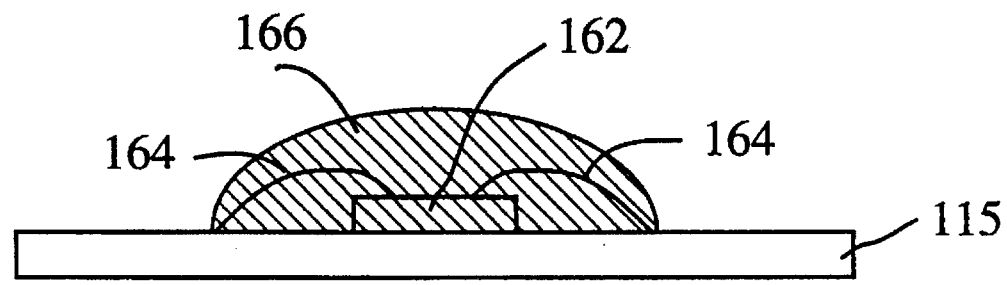

Another advantage of the described packaging arrangement for peripheral cards is the fact that it supports the use of chip-on-board and/or chip-on-tape connected integrated circuit. The mounting of such an integrated circuit on the printed circuit board 115 may be accomplished using conventional techniques. By way of example, a suitable chip-on-board mounting scheme is diagrammatically illustrated in FIGS. 6a–d. An integrated circuit die 162 is attached to the printed circuit board 115 in FIG. 6a. To electrically connect the die 162 to the circuit board 115, bonding wires 164 are secured between die pads on the die 162 and associated traces on the printed circuit board 115 as best illustrated in FIG. 6b. To protect these wires 164 during the injection of the packaging material 140, a glob topping 166 may optionally be applied as illustrated in FIG. 6c. The peripheral card can then be packaged using either of the described methods.

In the context of the construction of a computer peripheral card 110, the steps described with reference to FIGS. 6a–c may be permuted with the positioning steps described with reference with FIGS. 4a–c and FIGS. 5a–d. For example, the integrated circuit die 162 may be attached to the circuit board 115 after either the board 115 or the panel 148 is positioned in the mold 142 or 156. Likewise, the steps associated with FIGS. 6b and 6c may be performed before or after the board 115 or panel 148 is positioned in either mold 142 or 156.

In yet further embodiments of the invention, the peripheral card may be arranged to encapsulate a plurality of components and/or integrated circuits in a manner that eliminates the need for a printed circuit board altogether. Typically, in such embodiments, the components and/or chips would be mounted on or incorporated into a substrate or other suitable support, although such a support is not necessary. In such embodiments, the various integrated circuits and the female PCMCIA connector 120 may be connected to one another in any conventional manner such as by use of a multichip substrate, wire bonding, the use of a leadframe, etc. to accomplish the electrical connections. The advantage of the present invention is that regardless of how the chips and/or components are supported, they can be packaged using injection molding techniques to provide relatively strong and inexpensive peripheral card packaging.

Although only a few embodiments of the present invention have been described in detail, it should be understood that the present invention may be embodied in many other specific forms without departing from the spirit or scope of the invention. Particularly, the order of the steps of mounting electrical components on the circuit board, attaching the connector 120 to the PC board, and positioning the PC board or the panel in the molds may be permuted. Of course, the manner in which the ICs are packaged and/or attached to the printed circuit board or to the substrate is not important to the invention. Thus, tape automated bonding (TAB), flip chip, and bonded interconnect pin (BIP) packaging and any other suitable component packaging may be used. When chip on board and/or chip on substrate packaging is used, the described glob-topping technique is entirely optional and can be used at the discretion of the manufacturer. The printed circuit board need not be rectangular and the arrangement of circuit boards is not restricted to those shown in the figures. The panel and its circuit boards may be supported by PC boards or supports underneath the panel or molds in a wide variety of ways. For example, the outline of the mold may not be the same size as either the panel or individual printed circuit boards.

Also, although the invention has been described primarily in connection with PCMCIA peripheral cards, it has applications outside of the current PCMCIA peripheral card standards. Of course the functions of the peripheral cards and the circuit components used to accomplish those functions may be widely varied in order to perform any particular task required. Thermoset plastics have been described as a preferred packaging material, however, it should be appreciated that other plastics such as various thermoplastics may be used instead of thermoset plastic. Further, when desired, the plastic packaging material may be doped with an appropriate conductor such as iron to suppress RF signals generated by a wireless communicator. This doping may obviate the need for RF shields 125. Also, metal jackets may be held against the walls of the molds by a vacuum to form outer metal surfaces of the PCMCIA cards. These jackets can facilitate discharge of static electricity and protect components of the electronic device from radiation generated by the card. In view of the foregoing, it should be apparent that the present examples are to be considered as illustrative and not restrictive, and the invention is not to be limited to the details given herein, but may be modified within the scope of the appended claims.

We claim:

1. A portable peripheral card for use with an electrical device comprising:

a printed circuit board having electrical components mounted thereon;

an electrical connector attached to the printed circuit board for permitting communications between the electrical components on the printed circuit board and the electrical device; and a solid one-piece package that completely encapsulates the printed circuit board and the electrical components thereon yet exposes a portion of the electrical connector to facilitate electrical connections between the printed circuit board and the electrical device.

2. A portable peripheral card as recited in claim 1 wherein said peripheral card is a PCMCIA card.

3. A portable peripheral card as recited in claim 1 wherein said electrical components are mounted on both sides of said printed circuit board.

4. A portable peripheral card as recited in claim 1 wherein said electrical components include board mounted components.

5. A portable peripheral card as recited in claim 4 wherein said electrical components include a plastic encapsulated single chip integrated circuit.

6. A portable peripheral card as recited in claim 4 wherein said electrical components include a chip selected from a group consisting of a chip-on-board, a tap-automated bonded chip, a flip chip, and a bonded interconnect pin.

7. A portable peripheral card as recited in claim 6 further comprising bonding wires for connecting said chip to said printed circuit board.

8. A portable peripheral card as recited in claim 1 wherein a plurality of said electrical components are packaged in a multi-chip package and wherein said electrical connector is a female connector.

9. A portable peripheral card as recited in claim 1 wherein said solid one-piece package is formed from plastic.

10. A portable peripheral card as recited in claim 9 wherein said solid one-piece package is formed from thermoset plastic.

11. A portable peripheral card as recited in claim 9 wherein said solid one-piece package is formed from thermoplastic.

12. A portable PCMCIA peripheral card for use with an electrical device comprising:

a plurality of integrated circuits that are electrically coupled to one another;

a PCMCIA connector receptacle electrically coupled to at least one of the integrated circuits for permitting communications between the integrated circuits and the electrical device; and a solid one-piece package that completely encapsulates the integrated circuits yet exposes a portion of the PCMCIA connector receptacle to facilitate electrical connections between the integrated circuits and the electrical device.

13. A portable PCMCIA peripheral card as recited in claim 12 wherein said PCMCIA connector receptacle is a female connector receptacle.

14. A portable PCMCIA peripheral card for use with an electrical device comprising:

a printed circuit board having electrical components mounted on both sides of the printed circuit board, wherein the electrical components include at least one plastic encapsulated single chip integrated circuit;

a PCMCIA female connector receptacle electrically attached to the printed circuit board for permitting communications between the electrical components on the printed circuit board and the electrical device; and a solid one-piece package that completely encapsulates the integrated circuits and the electrical components thereon yet exposes a portion of the PCMCIA female connector receptacle to facilitate electrical connections between the printed circuit board and the electrical device, wherein the solid one-piece package is formed from plastic.

* * * * *